United States Patent [19]
Ookubo et al.

[11] 4,079,360
[45] Mar. 14, 1978

[54] MAGNETIC FIELD SENSING APPARATUS

[75] Inventors: Hiroyuki Ookubo, Narashino; Yoshimi Makino, Fujisawa, both of Japan

[73] Assignee: Sony Corporation, Tokyo, Japan

[21] Appl. No.: 597,007

[22] Filed: Jul. 18, 1975

[30] Foreign Application Priority Data

Jul. 26, 1974 Japan .................................. 49-89883

[51] Int. Cl.$^2$ .............................................. G11c 11/14
[52] U.S. Cl. ........................................ 365/158; 365/97; 235/449; 338/32 R
[58] Field of Search .................... 340/174 TF, 174 CA, 340/174 EB, 174 PM

[56] References Cited
U.S. PATENT DOCUMENTS

| | | | |
|---|---|---|---|
| 3,736,419 | 5/1973 | Almasi et al. ................. | 340/174 TF |
| 3,928,836 | 12/1975 | Makino et al. ................. | 340/174 EB |

FOREIGN PATENT DOCUMENTS

7,312,099  4/1974  Netherlands.

*Primary Examiner*—Marshall M. Curtis

*Attorney, Agent, or Firm*—Lewis H. Eslinger; Alvin Sinderbrand

[57] ABSTRACT

Apparatus is provided for producing an output signal upon sensing the proximity of a source of magnetic field. The apparatus includes a magnetoresistive element which is comprised of an insulating substrate upon which first and second ferromagnetic strips are provided. The ferromagnetic strips define first and second main current conducting paths which are respectively perpendicular to each other. The strips are connected in series to define a junction therebetween from which an output signal is derived. Current supply terminals are provided for furnishing an energizing current to the magnetoresistive element. Impedances are connected in parallel with the series-connected strips to thereby form a bridge circuit with the ferromagnetic strips, the junction between the strips serving as a bridge output terminal. A generator magnet has a surface disposed in a plane spaced from the magnetoresistive element and produces a magnetic field which is sensed by the element. An output signal is produced from the junction in the element as a function of the relative positions of leading and trailing edges of the generator magnet with respect to a leading edge of the magnetoresistive element.

22 Claims, 32 Drawing Figures

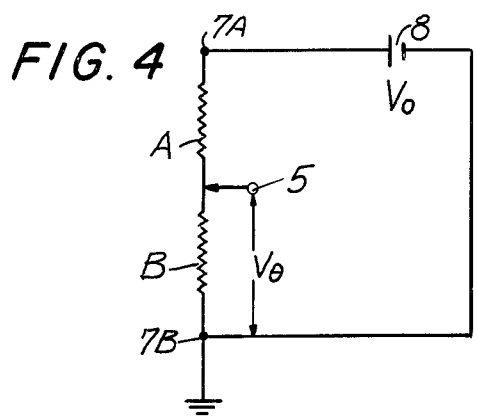
FIG. 4
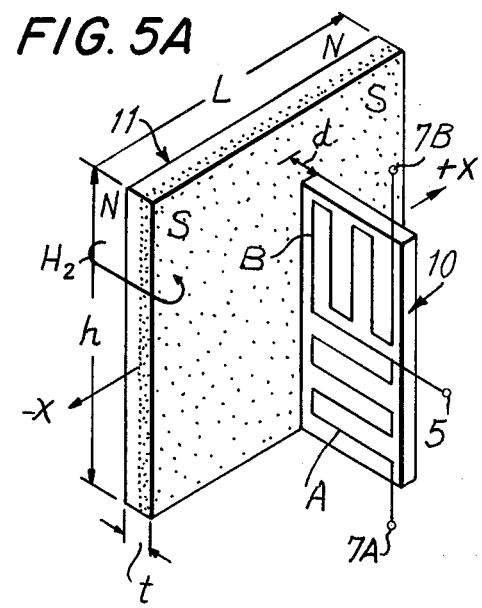
FIG. 5A
FIG. 5B
FIG. 5C

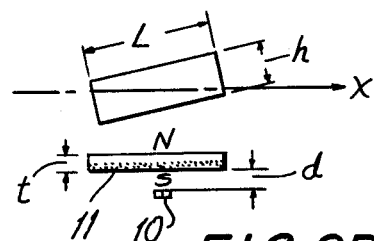
FIG.9A
FIG.9B
FIG.9C
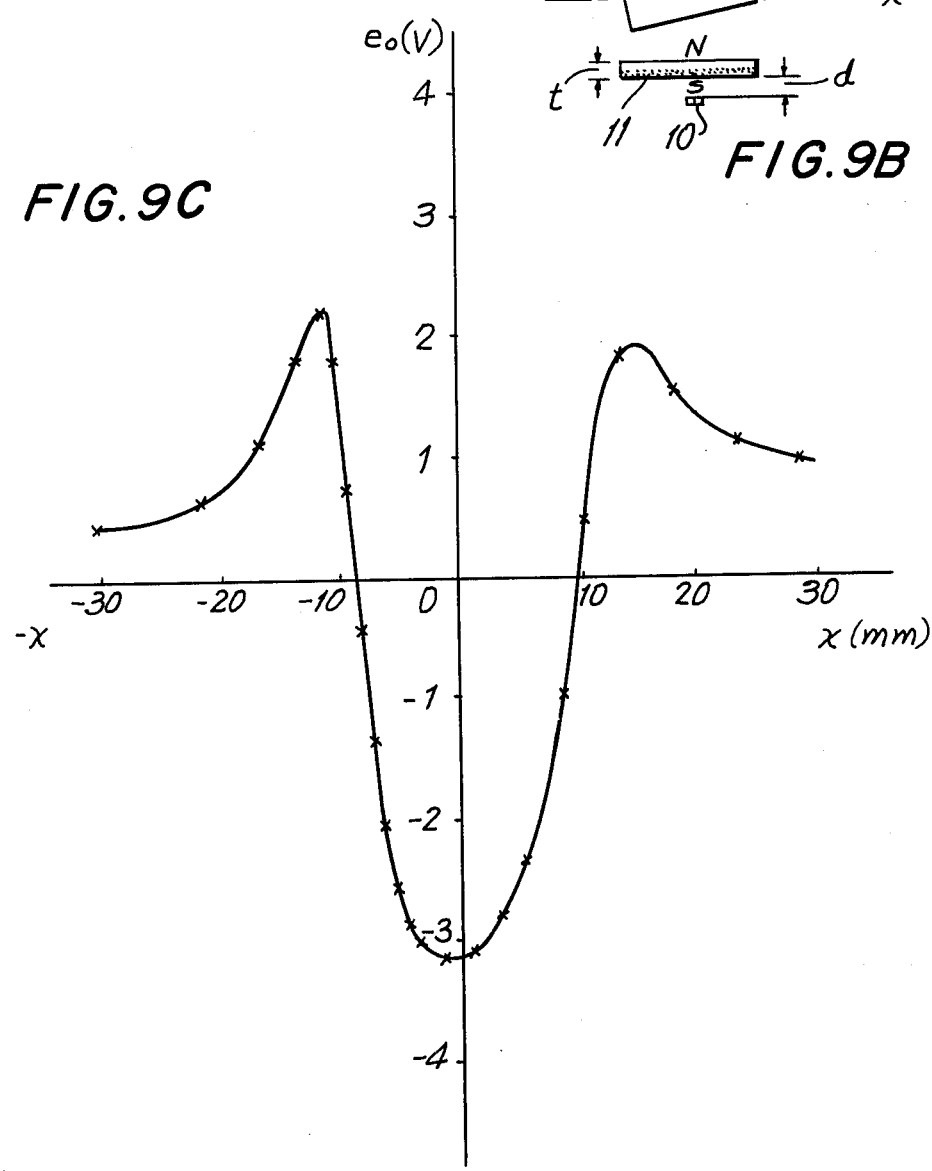

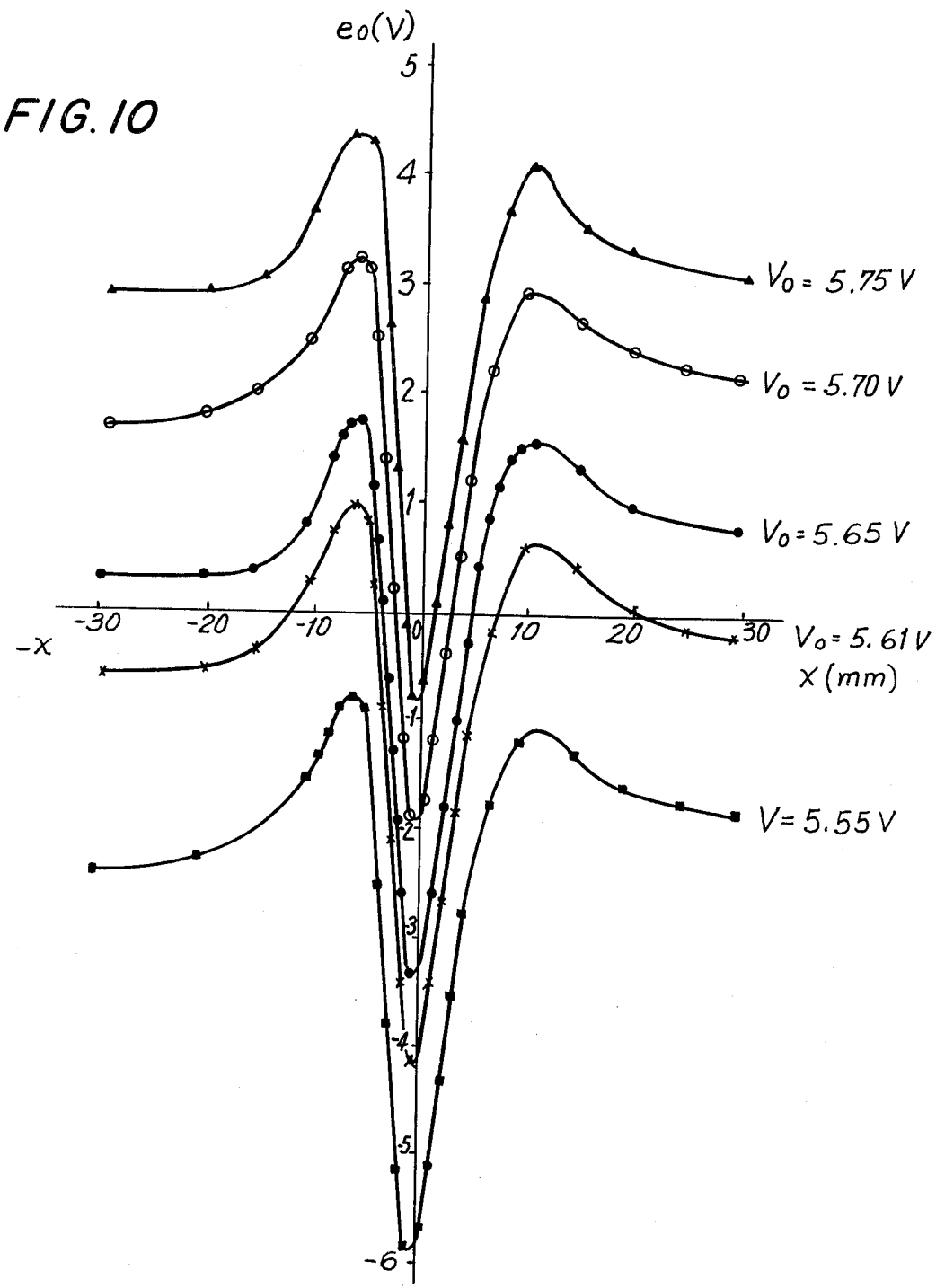

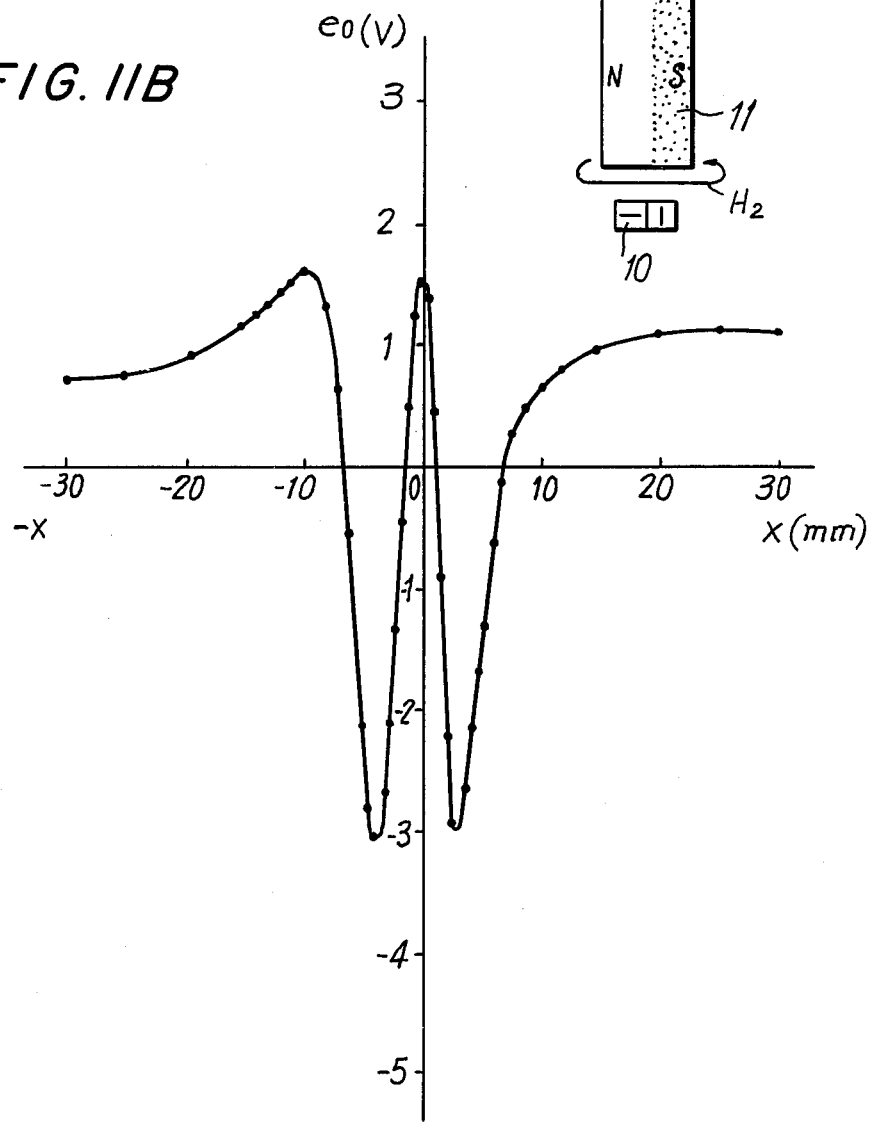
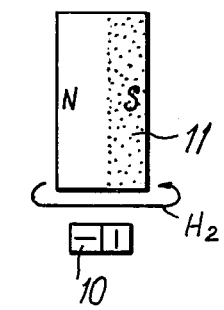
FIG. 11A
FIG. 11B

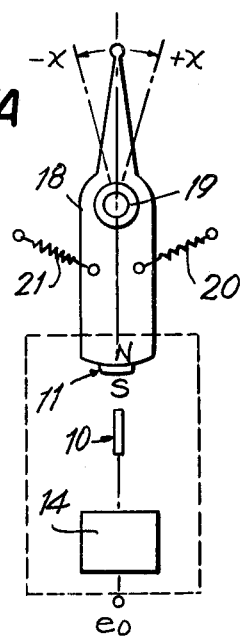
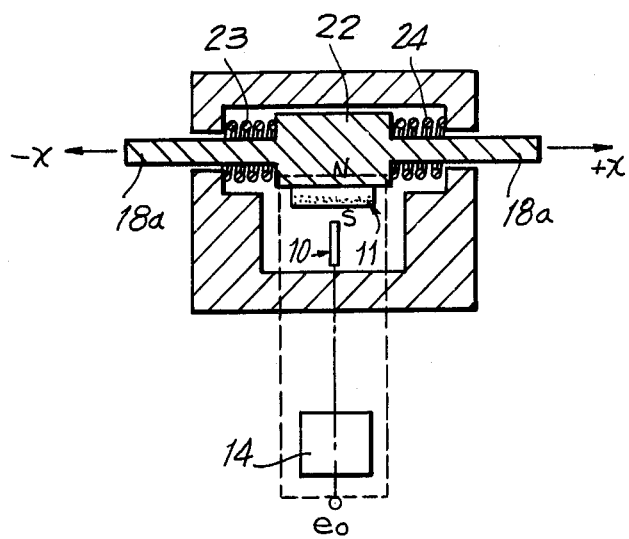
FIG.17A    FIG.18A
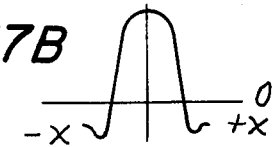
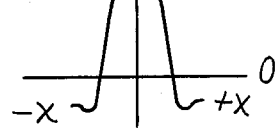
FIG.17B    FIG.18B
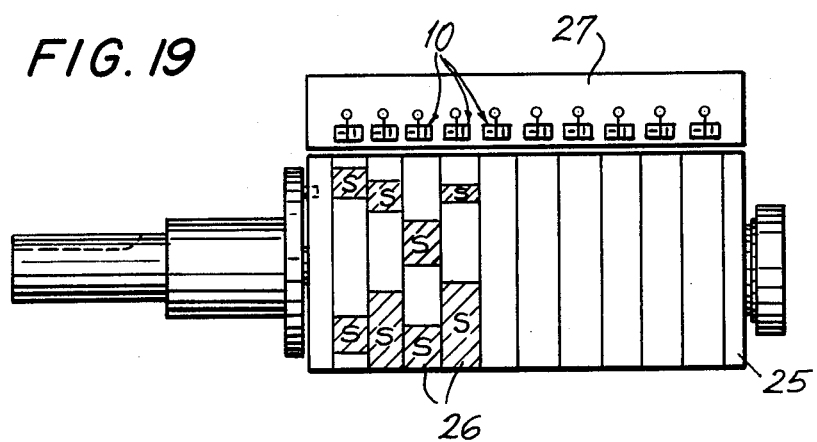
FIG.19

MAGNETIC FIELD SENSING APPARATUS

BACKGROUND OF THE INVENTION

This invention relates to apparatus for producing an output signal upon sensing a magnetic field and, in particular, to an application of such apparatus as a contactless switch which is actuated by the proximity of a magnetic field.

In many applications it is desired to produce a switching function as a function of a mechanical device, but without the use of mechanical contacts which must be engaged by and thus physically closed by the mechanical device. Such an operation generally can be achieved by a contactless switch. That is, depending upon the position of the mechanical device in question, a switching function, such as the actuation of an electronic switching element, can be performed. Generally, diverse types of contactless switches are known. Among these are photoelectric devices, electrostatic devices and magnetic-sensitive devices, all of which can be used to perform a switching function without actual physical engagement of mechanical contacts.

A typical magnetic-sensitive contactless switching element which has been used heretofore is the well-known magnetic head which is generally used as an electro-magnetic transducer for recording and playback operations in the tape recording art. When used as a contactless switch, an electric output signal is produced as a function of a magnet which is juxtaposed to the magnetic head. Consequently, when the relative position of the magnetic head and a magnetic pole is changed, this change in position produces the electric output signal. Hence, depending upon the particular application thereof, the magnetic head can be used to produce various switching functions, accordingly.

However, the use of the magnetic head as a contactless switch suffers from various disadvantages. One disadvantage is the relatively large structure which must be used. The magnetic head requires an electromagnetic coil element, a suitable supporting core and a bias signal oscillator in order for the head to detect the presence and proximity of an external magnetic field. Furthermore, for those applications wherein the magnetic head is to be used as a contactless limiter switch, a highly sensitive output cannot be achieved unless the head is very closely spaced adjacent the source of magnetic field, that is, the magnet. Such very close spacing severely limits the applications of this head to contactless switching arrangements. Hence, the magnetic head does not enjoy divers usage, nor has it been overwhelmingly successful in many commercial applications.

OBJECTS OF THE INVENTION

Therefore, it is an object of the present invention to provide apparatus for producing an output signal in response to the sensing of a magnetic field.

It is another object of this invention to provide a magnetically actuated contactless switch which does not suffer from the disadvantages attending prior art devices.

Yet another object of this invention is to provide a magnetic field detector including a magnetoresistive element capable of producing an output signal in response to the proximity of a magnetic field source.

Yet another object of this invention is to provide a contactless switch including a magnetoresistive element.

A still further object of the present invention is to provide a miniature, highly sensitive magnetic field sensing device which can be used as a contactless switch.

An additional object of this invention is to provide apparatus for providing an indication of the relative position of a generator magnet.

A further object of the present invention is to provide apparatus for detecting when a movable member has been displaced beyond tolerable limits.

Another object of this invention is to provide apparatus for producing an encoded representation of the angular position of a rotary element.

Still another object of the present invention is to provide a magnetic-sensitive card reader for an information card.

Various other objects and advantages of the present invention will become apparent from the ensuing detailed description and the novel features will be particularly pointed out in the appended claims.

SUMMARY OF THE INVENTION

Apparatus is provided for producing an output signal upon sensing the proximity of a source of magnetic field comprising a magnetoresistive element which has an insulating substrate and first and second ferromagnetic strips on the substrate for providing first and second main current conducting paths which are perpendicular to each other, the strips being connected in series to define a junction therebetween; impedance elements connected in parallel with the series-connected strips to form a bridge circuit wherein the junction between the strips comprises a bridge output terminal; and a generator magnet for producing a magnetic field has a surface disposed in a plane spaced from the magnetoresistive element to produce an output signal from the bridge circuit as a function of the relative positions of leading and trailing edges of the generator magnet with respect to a leading edge of the magnetoresistive element.

BRIEF DESCRIPTION OF THE DRAWINGS

The following detailed description will best be understood in conjunction with the accompanying drawings in which:

FIG. 4 is an equivalent circuit diagram of FIG. 2;

FIGS. 5A–5C are schematic representations of how the magnetoresistive element is used to produce output signals as a function of a proximate magnetic field;

FIGS. 9A–9C depict further arrangements wherein an output signal is reproduced as a function of the proximity of a magnetic field;

FIG. 10 is a graphical representation showing how the output signal derived from a magnetoresistive element in accordance with this invention changes as a circuit parameter changes;

FIGS. 11A and 11B depict how the present invention can be used to produce a modified output signal;

FIGS. 17A and 17B schematically represent how the present invention can be used to sense the rotating displacement of a rotatable member;

FIGS. 18A and 18B schematically depict how the present invention can be used to detect the linear displacement of a movable element;

FIG. 19 is a schematic representation of how the present invention can be used to produce an encoded representation of angular rotation.

DETAILED DESCRIPTION OF CERTAIN ONES OF THE PREFERRED EMBODIMENTS

Figure 1:
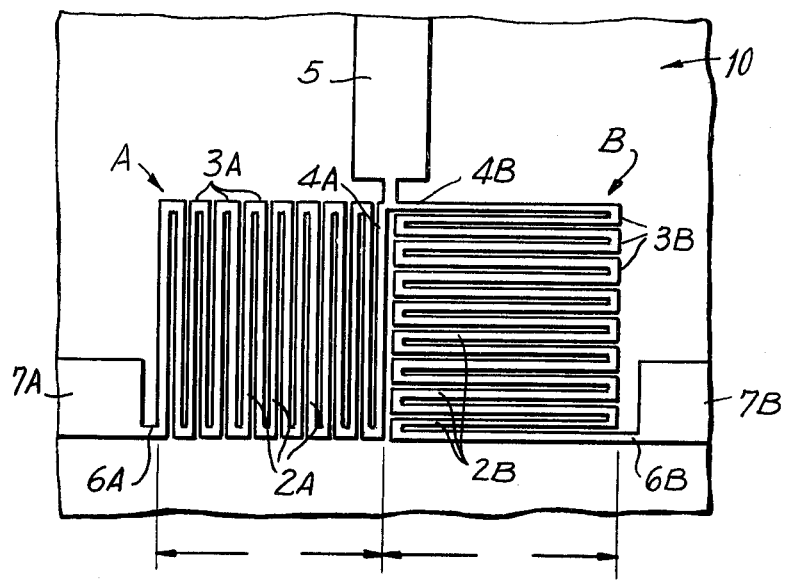
FIG. 1 is a plan view of a magnetoresistive element which can be used in one embodiment of the invention.

Referring now to the drawings wherein like reference numerals are used throughout and, in particular, to FIG. 1, there is illustrated a schematic representation of a magneto-resistive element 1 which can be used with the present invention. A thin film of ferromagnetic material is deposited, as by a conventional vacuum evaporation technique, for example, on an insulating substrate to a depth of approximately 600 to 1,000 A. Typical examples of the substrate are a glass slide, a photographic dry plate, or the like. Other suitable materials can be used. Then, the thin film is etched so as to form the ferromagnetic strips A and B in zig-zag or serpentine configuration, as shown, or in strips, together with the terminals 5, 7A and 7B. The ferromagnetic strips A and B comprise a plurality of main current conducting paths 2A and 2B and associated connecting portions 3A and 3B, respectively. The main current paths 2A and 2B are substantially perpendicular to each other. As viewed in FIG. 1, the strips A are capable of conducting current predominantly in the vertical direction and the strips B are capable of conducting current predominantly in the horizontal direction. Of course, as is realized, other mutually perpendicular current conducting directions can be employed. The last path 4A of the main current path 2A is connected to the first path 4B of the main current path 2B in series. The connecting junction defined by the last path 4A and the first path 4B is connected to the terminal 5. The terminals 7A and 7B are adapted to serve as current supply terminals to the magnetoresistive element and are connected to the paths 2A and 2B by portions 6A and 6B, respectively.

The magnetoresistive element 10 is disclosed in further detail in copending Application Ser. No. 487,282, filed July 10, 1974, and assigned to the same assignee of the present invention. Also, the use of this magnetoresistive element to detect the direction of a magnetic field is disclosed in copending Application Ser. No. 597,818. As described in the latter application, it is preferable to use the magneto-resistive element 10 in a magnetic field having sufficient intensity to saturate the ferromagnetic strips A and B so as to obtain a self-limiting effect at the output signal, whereby the output signal is substantially insensitive to changes in field intensity.

Figure 2:
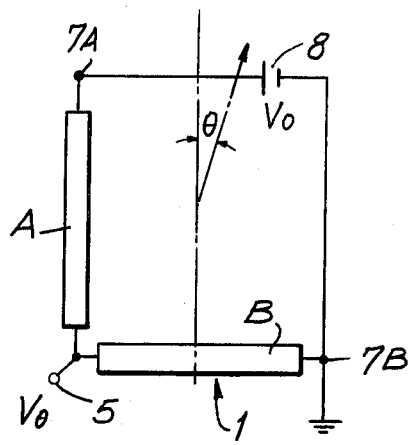
FIG. 2 is a schematic view illustrating the principles of operation of a magnetoresistive element as applied to this invention.
Figure 3:
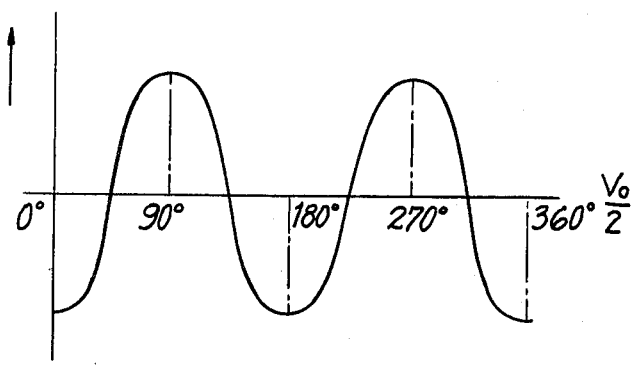
FIG. 3 is a graph illustrating the relationship between a change in the output signal of the magnetoresistive element and the direction of a magnetic field applied thereto.

Turning to FIG. 2, the strips A and B are schematically represented as being connected electrically to each other in series. The current supply terminals 7A and 7B are connected to the opposed ends of the strips A and B, and the output terminal 5 is connected to the junction defined by the series connection of the strips. A power source 8 is connected between the current supply terminals 7A and 7B. One current supply terminal 7 is connected to a reference potential, such as ground. The resultant magnetoresistive element forms a sensing circuit 1 for detecting magnetic fields.

Let it be assumed that a magnetic field H having an intensity sufficient to saturate the strips A and B is applied to the strips at an angle $\theta$ relative to the longitudinal direction of the strip A. Generally, the resistance of a saturated ferromagnetic material is anisotropic. That is, the resistance of such a material is greater in the direction of magnetization than in the direction perpendicular thereto. Accordingly, resistances $\rho_A$ and $\rho_B$ of the strips A and B can be represented by the Voight-Thomson formula:

$$\rho_A^{(\theta)} = \rho_\perp \sin^2\theta + \rho_\parallel \cos^2\theta \quad (1)$$

$$\rho_B^{(\theta)} = \rho_\perp \cos^2\theta + \rho_\parallel \sin^2\theta \quad (2)$$

where $\rho_\perp$ is the resistance of the ferromagnetic strip A or B when saturated with a magnetic field perpendicular to the longitudinal direction of the strip, and $\rho_\parallel$ is the resistance of the ferromagnetic strip when saturated with a magnetic field parallel with the longitudinal direction of the strip.

FIG. 4 represents an equivalent circuit of the magnetoresistive element shown in FIG. 2. A voltage $V(\theta)$ at the output terminal 5 will be derived by voltage division and is represented by $$V(\theta) = \frac{\rho_B(\theta)}{\rho_A(\theta) + \rho_B(\theta)} \cdot V_o \quad (3)$$

where $V_o$ is the voltage of the power source 8.

By substitution of equations (1) and (2) into equation (3), and by rearranging terms, $$V(\theta) = \frac{V_o}{2} - \frac{\Delta\rho \cos 2\theta}{2(\rho_\parallel + \rho_\perp)} \cdot V_o \quad (4)$$

where $\Delta\rho = \rho_\parallel - \rho_\perp$.

In equation (4), the first term represents a constant voltage $V_s$ which is a function of the power source $$(V_s = \frac{V_o}{2}),$$

and the second term represents a change or deviation from the constant voltage, attributed to the influence of the magnetic field H. This change in the output voltage is represented as $V(\theta)$. If the resistance of the ferromagnetic strip A or B in the absence of the field H is expressed as $\rho_0$, and if $2\rho_0 = \rho_{\parallel} + \rho_{\perp}$, then $\Delta V(\theta)$ can be rewritten as $$\Delta V(\theta) = -\frac{\Delta\rho}{4\rho_o} \cdot \cos2\theta \cdot V_o \quad (5)$$

It is appreciated, from equation (5), that $V(\theta)$ is a maximum positive or negative value, that is, the absolute value of the change of the output voltage is maximum, at angles $\theta$ of 0°, 90°, 180° and 270°, where $\cos 2\theta$ is $\pm 1$.

Equation (4) can be graphically depicted as shown in FIG. 4. As is apparent, the output $V(\theta)$ of the magnetoresistive element is equal to $V_o/2$ when the magnetic field H is applied to the strips at an angle $\theta = 45°$. That is, $V(\theta)=0$ because at $\theta=45°$, $\cos2\theta=0$. Also, the output voltage $V(\theta)$ is minimum and maximum at angles $\theta = 0°$ and 90° respectively.

The manner in which the magnetoresistive element depicted in FIG. 1 and mathematically described hereinabove is turned to account in the present invention now is described. FIGS. 5A-5C depict the positional relation between a generator magnet 11 which is adapted to function as a source of magnetic field, and a magnetoresistive element 10. Preferably, the generator magnet 11 is magnetized in the direction of its thickness $t$. That is, one surface of the magnet is provided with a south pole S and the opposite surface is provided with a north pole N. For the purpose of discussing the present invention, the pole face S of FIGS. 5A-5C will be assumed to lie in a plane which is spaced from the magnetoresistive element 10 by a distance $d$. In FIG. 5A, the substrate surface of the magnetoresistive element 10, hereinafter the plane of the magnetoresistive element, is seen to be substantially perpendicular to the S-pole face.

The generator magnet has a length dimension L and a height dimension $h$. The magnet is bidirectionally movable in the $\pm x$ direction. In the illustrated embodiment, the magnetic field $H_2$ produced by the magnet 11 is seen to be substantially parallel to the plane of the magnetoresistive element. If the edge of the magnetoresistive element which is closest to the generator magnet 11 is assumed to be the leading edge of the element, and if the rightmost edge of the magnet 11 and the leftmost of the magnet are assumed to be the leading and trailing edges, respectively, when the magnet is moved in the $\pm x$ direction, it will soon be seen that the magnetoresistive element produces a signal at the output terminal 5 which is a function of the relative positions of the leading and trailing edges of the generator magnet 11 with respect to the leading edge of the magnetoresistive element 10.

FIG. 5B is an alternative configuration wherein the magnetoresistive element 10 is juxtaposed the generator magnet 11. Similar to the FIG. 5A embodiment, the magnetoresistive element 10 is spaced from the S-pole face by a distance $d$ and the generator magnet 11 is adpated to be bidirectionally moved in the $\pm x$ direction. However, here the magnetoresistive element 10 is seen to have been rotated in the clockwise direction by 90°. As thus configured, the left-most edge of the magnetoresistive element 10 in the FIG. 5B embodiment may be considered to be the leading edge of the magnetoresistive element. Hence, depending upon the relation between the leading and trailing edges of the generator magnet 11 with this leading edge of the magnetoresistive element 10, an output signal is derived from the element output terminal 5.

In the FIG. 5C embodiment, it is seen that the S-pole face of the generator magnet 11 is substantially parallel to the plane of the magnetoresistive element 10, and is spaced therefrom by the distance $d$.

As will be described in greater detail hereinbelow with respect to FIGS. 8A-8C, the magnetoresistive element 10 in the FIG. 5 embodiment produces an output signal as a function of the magnetic field detected by the element. Preferably, the field $H_2$ produced by the generator magnet 11 should have a component which is parallel to the plane of the magnetoresistive element. In FIGS. 5A and 5B, it is seen that the major component of the field $H_2$ is so parallel. However, in the embodiment shown in FIG. 5C, it is seen that only a minor component of the field $H_2$ is parallel to the plane of the element 10. Nevertheless, even this minor component will produce an output signal at the output terminal 5. The type of output signal which is produced and the positional relationship between the element 10 and the magnet 11 which is determinative of the output signal is described below.

Figure 6:
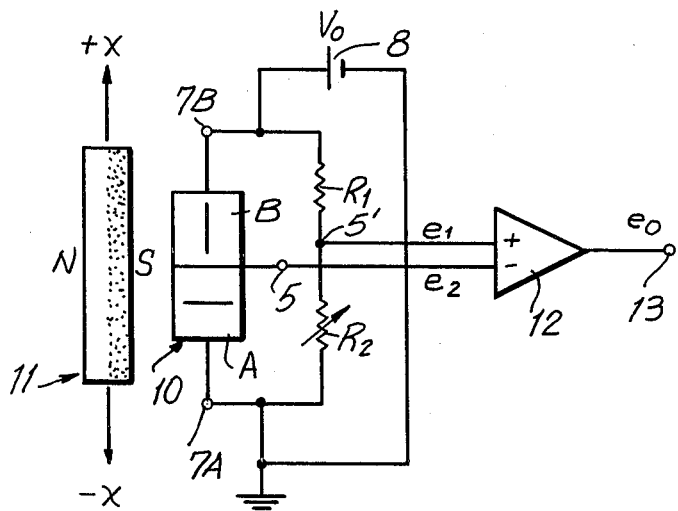
FIGS. 6 and 7 are schematic diagrams showing how the output signals produced by the magnetoresistive elements are processed to produce a further output signal.

Referring now to FIG. 6, a schematic circuit diagram is shown whereby an output signal $e_0$ is produced when the magnetoresistive element 10 senses the linear movement of the generator magnet 11. It is appreciated that the positional relation between the element 10 and the magnet 11 corresponds to the embodiment previously described with respect to FIG. 5B.

Series-connected resistors $R_1$ and $R_2$ are coupled to the current supply terminals 7A and 7B of the magnetoresistive element 10 to thereby form a bridge circuit having bridge output terminals 5 and 5', respectively. This bridge circuit is energized by the power supply 8 which supplies a bias voltage $V_0$.

The bridge output terminals 5 and 5' are coupled to the input terminals of a differential amplifier 12, the output terminal of which being connected to the circuit output 13 from which the output signal $e_0$ is derived. The differential amplifier 12 is conventional and may comprise an operational amplifier having a positive input terminal connected to the bridge output terminal 5' and a negative input terminal connected to the bridge output terminal 5. Of course, if desired, these input terminal connections to the differential amplifier can be reversed.

Balance of the illustrated bridge circuit is achieved by adjusting the resistor $R_2$ which, accordingly, may comprise a potentiometer, a rheostat, or the like.

Let it be assumed that the magnetoresistive element 10 is capable of producing an output signal which is a function of the positional relation between the generator magnet 11 and the element 10. This positionally related output signal can be represented as $V(x)$. This signal $V(x)$ is analogous to the signal $V(\theta)$ of equation (5) above. Accordingly, it is seen that the output signal $e_2$ applied to the output terminal 5 of the magnetoresistive element 10 can be expressed as: $e_2 = \frac{1}{2}V_0 + V(x)$. The output signal $e_1$ appearing at the bridge output terminal 5' is recognized as being equal, merely, to $e_1 = \frac{1}{2}V_0$.

The differential amplifier 12 operates to subtract the signal $e_2$ from the signal $e_1$ and to suitably amplify this difference signal. Hence, if the differential amplifier 12 is assumed to have a voltage gain $\alpha$, then the output signal supplied to the terminal 13 is seen to be equal to: $e_0 = \alpha(e_1 - e_2) = \alpha V(x)$. Thus, the output signal $e_0$ produced by the illustrated circuit is a direct representation of the positional relation between the magnetoresistive element 10 and the generator magnet 11. Relative movement therebetween results in a corresponding change in the output signal $e_0$. As will soon be seen, in many applications it is preferred that the magnetoresistive element 10 remain stationary.

Figure 7:
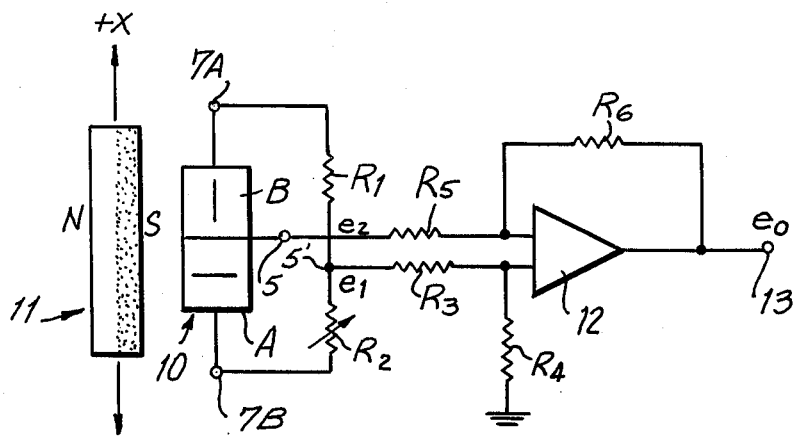

Another embodiment of the circuit schematically shown in FIG. 6 is depicted in the schematic diagram of FIG. 7. It is seen that, in this alternative embodiment, the bridge output terminal 5 is coupled through a resistive $R_5$ to an input terminal of the differential amplifier 12. A feedback resistor $R_6$ is provided to interconnect the differential amplifier output terminal with this input terminal. Also, the bridge output terminal 5' is coupled through a voltage divider formed of the series-connected resistors $R_3$ and $R_4$ to the other input terminal of the differential amplifier.

Accordingly, in the FIG. 7 embodiment, the bridge output signal $e_1$ is divided by the resistors $R_3$ and $R_4$, and the bridge output signal $e_2$ is divided by the resistors $R_5$ and $R_6$. The illustrated configuration of the differential amplifier 12 is conventional and, as is known to those of ordinary skill in the circuitry art, the output signal $e_0$ may be represented as:

$$e_o = \frac{(R_5 + R_6)}{(R_3 + R_4)} \cdot \frac{R_4}{R_5} \cdot e_1 - \frac{R_6}{R_5} \cdot e_2$$

Now, if $R_3$ is equal to $R_5$ and $R_4$ is equal to $R_6$, then the above equation reduces to:

$$e_o = \frac{R_6}{R_5} \cdot (e_1 - e_2)$$

Thus, in the FIG. 7 embodiment, it is seen that the output signal $e_0$ is a direct representation of the positional relation between the generator magnet 11 and the magnetoresistive element 10. Changes in the proximity of the magnet to the element, that is, changes in the relative positions of the leading and trailing edges of the magnet 11 with respect to the leading edge of the magnetorestive element 10 produces a corresponding change in the output signal $e_0$.

Figure 8A:
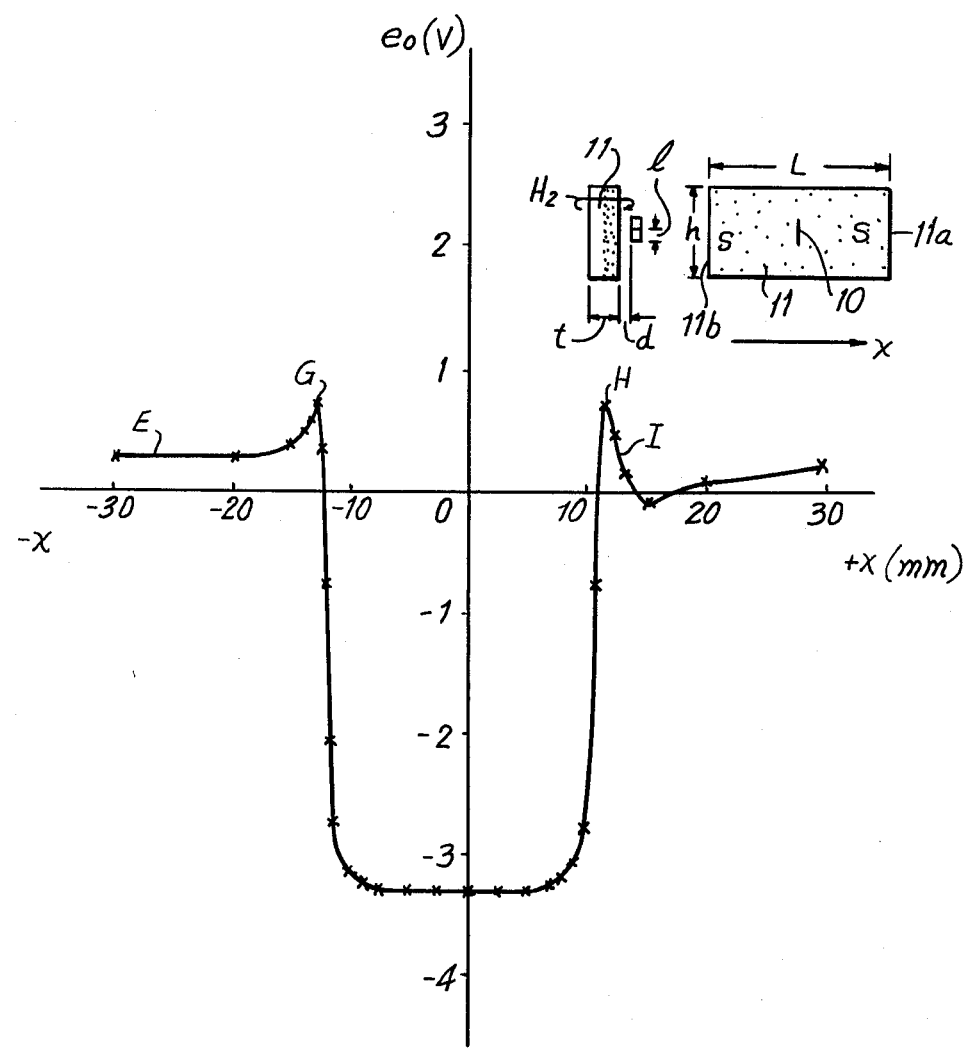
FIGS. 8A–8C are graphical representations of the output signals derived from the apparatus of the present invention.
Figure 8B:
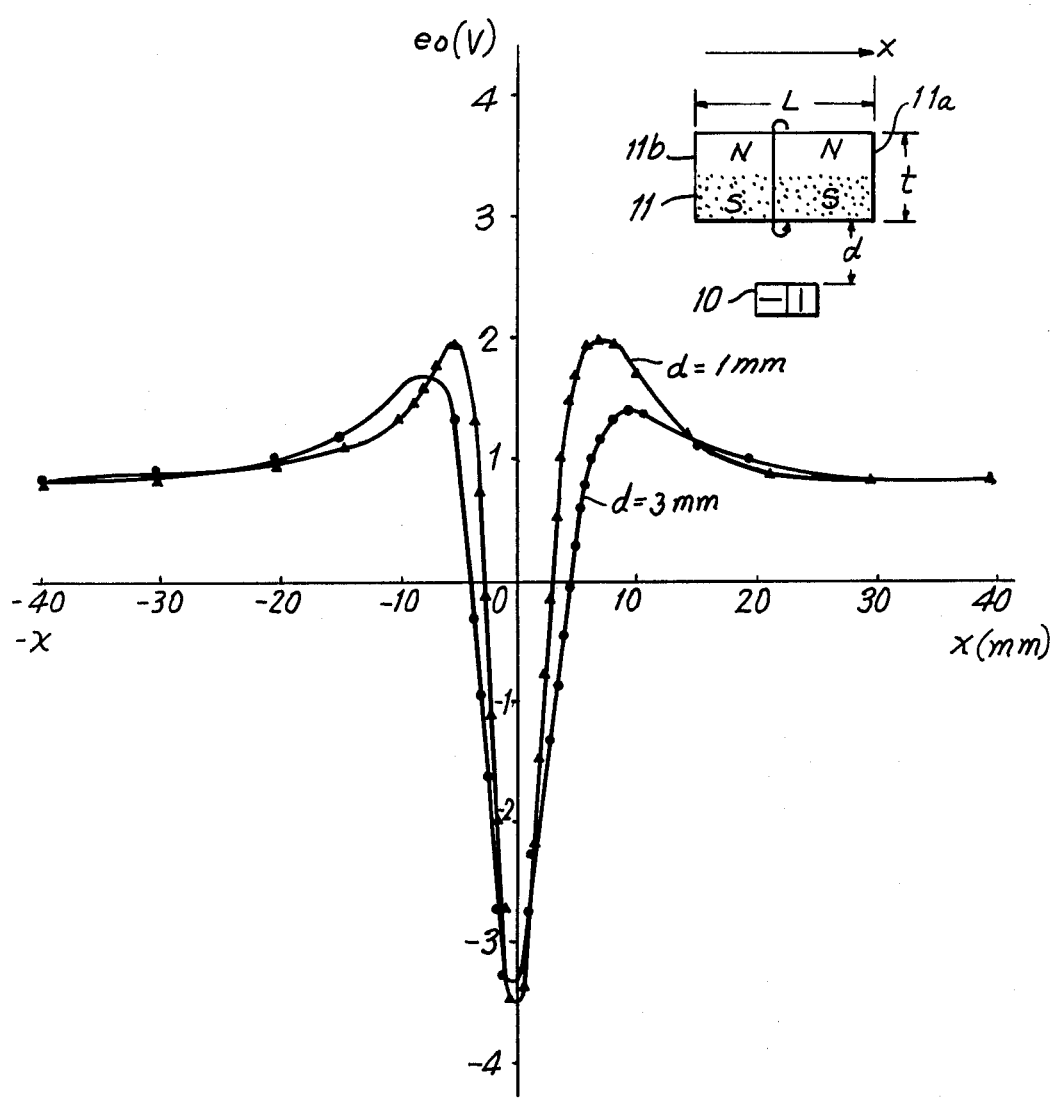
Figure 8C:
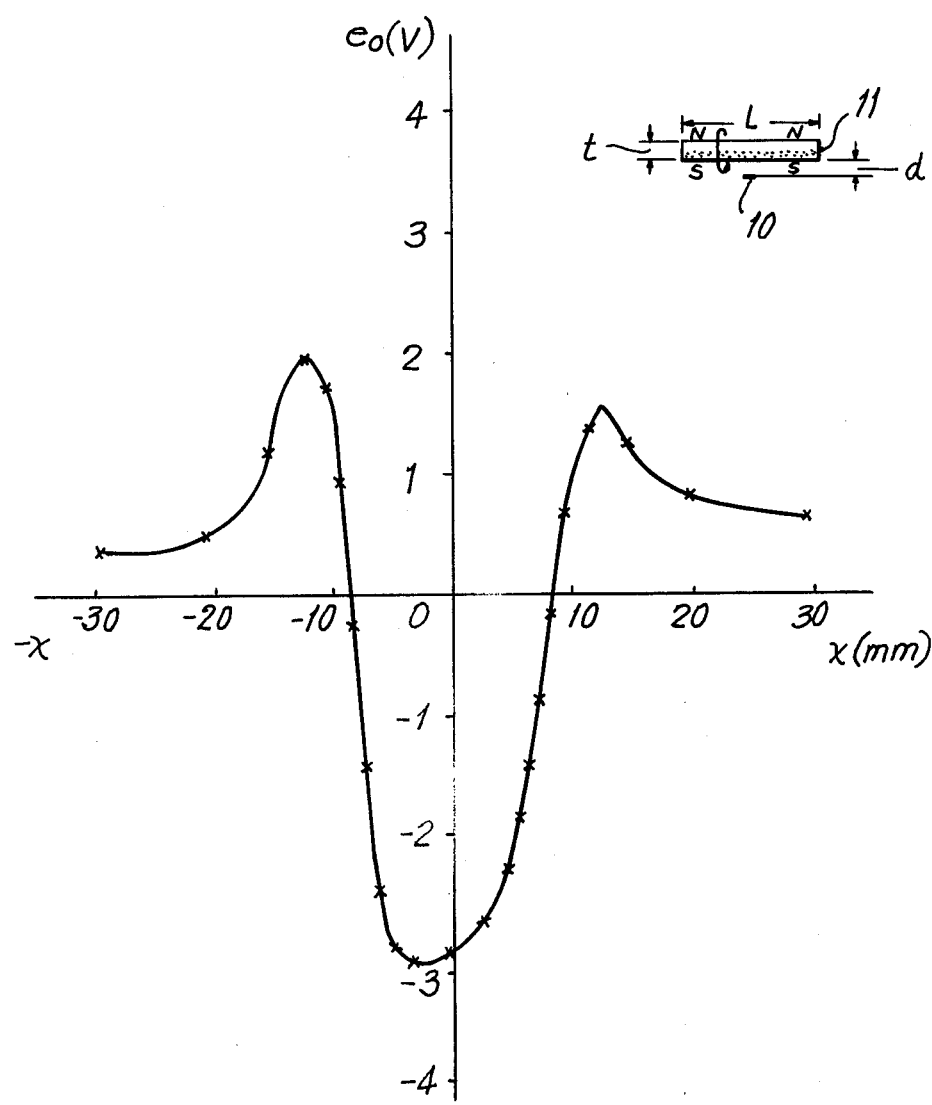

Reference now is made to FIGS. 8A–8C to provide a graphical representation of the output signal $e_0$ produced by the embodiments of FIGS. 6 and 7 when the positional relation between the generator magnet 11 and the magnetoresistive element 10 is varied. In each of these graphical representations, it will be assumed that the generator magnet 11 is dimensioned so as to have a length L in the $+x$ direction, a height $h$ and a thickness $t$. Also, it will be assumed that the surface of the generator magnet which is closest to the magnetoresistive element is disposed in a plane which is spaced from the element by the distance $d$. Finally, it will be assumed that each of the strips A and B on the substrate of the magnetoresistive element occupies an equal area having a length $l$ from the element midpoint to an opposite edge.

The output signal $e_0$ is represented as shown in FIG. 8A for the following parameters:
 $l$ = 1mm
 L = 20mm
 $h$ = 6mm
 $d$ = 1mm As shown, the generator magnet 11 is magnetized in the direction of its thickness $t$ and it is assumed, in this embodiment, that the S-pole face is closest to the magnetoresistive element 10 and the N-pole face is on the opposite surface of the magnet 11. Hence, the magnetic field $H_2$ is seen to emanate from the N-pole face and is directed toward the S-pole face. The major component of this field is parallel to the element 10.

Now, let it be assumed that, initially, the generator magnet 11, although spaced from the magnetoresistive element 10 by the constant distance $d$, is very far to the left from the element. Thus, the distance $-x$ can be considered to be infinite. At this distance, substantially none of the field $H_2$ is sensed by the magnetoresistive element 10. Consequently, the component V($x$) may be assumed to be zero. If the magnet 11 is moved closer to the magnetoresistive element 10 in the $+x$ direction, a portion of the flux produced by the magnet soon will be sensed by the element. This is represented as that portion E of the graphical representation. The polarity of this sensed flux may be attributed primarily to one or the other of the poles. In any event, as the generator magnet 11 is moved still closer to the magnetoresistive element 10, the sensed flux increases and the curve E correspondingly rises. However, a point is reached whereat the predominant flux polarity which is sensed by the element is reversed. That is, if the element had sensed the flux attributed to the N-pole, at the point G, the flux due to the S-pole suddenly is predominant. Consequently, because of this sharp change in the flux polarity which is sensed by the element 10, the output signal $e_0$ is correspondingly changed. For the parameters assumed above, when the leading edge 11a of the generator magnet 11 is approximately 12mm from the leading edge of the magnetoresistive element 10, the output signal $e_0$ undergoes the sharp change at the point G, as depicted.

The output signal $e_0$ now remains at the indicated level, for example, between $-3$ and $-4$ volts, until the trailing edge 11b of the generator magnet 11 has passed beyond the edge of the magnetoresistive element 10 by about 10mm. At that point, another sharp reversal in sensed flux polarity causes the output signal $e_0$ to rapidly rise to the point H. Then, as the generator magnet 11 is further moved in the $+x$ direction, the output signal $e_0$ appears as the curve I. As shown, this curve rapidly decreases below the zero level and then asymptotically rises as the magnet is moved still further away.

It is appreciated that the output signal $e_0$ having the curve depicted in FIG. 8A can be used as an indication of the proximity of the generator magnet 11 to the magnetoresistive element 10. Furthermore, this illustrated characteristic curve can be used as a switching function in a contactless switch.

Before describing typical applications of the magnetoresistive element 10 in combination with the generator magnet 11, reference is made to additional output characteristics in the produced output signal $e_0$. In FIG. 8B, graphical representations of the output signal $e_0$ are shown for a configuration of the type illustrated in FIG. 5B. The following parameters were used to obtain the illustrated graphs:
 $l$ = 1mm
 L = 6mm
 $h$ = 6mm
 $d$ = 1mm; 3mm The graphical representations of the output signal $e_0$ of FIG. 8B are somewhat similar to the aforedescribed representations shown in FIG. 8A. Thus, when the generator magnet 11 is very far to the left of the magnetoresistive element 10, the flux produced by the magnet has substantially no effect upon the element. However, as the magnet is moved in the $+x$ direction, flux of one polarity is sensed, resulting in the illustrated output signal $e_0$. The output signal $e_0$ increases as the leading edge 11a of the generator magnet 11 approaches the leading edge of the magnetoresistive element 10. As was described before, a point is reached whereat the flux polarity sensed by the magnetoresistive element suddenly is reversed. From that pont, further movement of the generator magnet in the $+x$ direction causes the output signal $e_o$ to fall below the 0 axis until a maximum peak voltage of about $-3.5$ volts is reached. This maximum peak voltage is obtained when the positional relation of the generator magnet 11 to the magnetoresistive element 10 is substantially symmetrical. Now, further movement of the generator magnet in the $+x$ direction causes the output signal $e_o$ to rise above the 0 axis until a point is reached whereat the polarity of the sensed flux again is changed. From that point, continued movement of the generator magnet causes the output signal $e_o$ to asymptotically approach the 0 axis.

It is seen from the graphical representation of FIG. 8B that the maximum peak voltage which is attained by the output signal $e_o$ is substantially the same regardless of whether the generator magnet 11 is spaced from the magnetoresistive element 10 by the distance $d$ equal to 1mm or 3mm. However, this change in the separation $d$ has a marked effect upon the 0 axis cross-points of the output signal.

The output signal $e_o$ which is produced when the magnetoresistive element 10 and the generator magnet 11 exhibit the arrangement shown in FIG. 5C is graphically represented in FIG. 8C. The parameters which were used to derive the illustrated output signal are:
1 = 1mm
L = 20mm
$h$ = 6mm
$t$ = 3mm
$d$ = 2.5mm It is seen that the general shape of the curve depicted in FIG. 8C is similar to that of the previously described curves of FIGS. 8A and 8B. However, the transitions of the FIG. 8C curve are not as sharp as that of the previously described curves.

A comparison of each of these curves indicates that, as the length L of the generator magnet 11 is changed, the zero crossing points thereof are correspondingly changed. If the distance between these zero crossing points, that is, the distance between the negative and positive transitions of the 0 axis, are considered as an indication of the dynamic range of the sensing function of the magnetoresistive element 10, it is appreciated that this dynamic range can be arbitrarily established in accordance with the particular length of the generator magnet. Also, if the thickness $t$ of the generator magnet 11 is increased, the generator magnet may be spaced from the magnetorestive element 10 by a correspondingly greater distance $d$.

The graphical representations in FIGS. 8A-8C indicate that the maximum peak value of the output signal $e_o$ exhibits a negative polarity. However, since this output signal $e_o$ is produced by the differential amplifier which, in turn, is supplied with the output signals $e_1$ and $e_2$ produced by the bridge circuit, it is recognized that the maximum peak value of the output signal $e_o$ can exhibit the opposite polarity (e.g. positive polarity) if the differential amplifier input terminals to which the bridge circuit output signals are supplied are interchanged. That is, with respect to the circuit of FIG. 6, if the bridge output signal $e_1$ is supplied to the differential amplifier negative input terminal, and if the bridge output signal $e_2$ is supplied to the positive input terminal, then the differential amplifier output signal $e_o$ shown in FIGS. 8A-8C will be inverted.

In deriving the curves graphically represented in FIGS. 8A-8C, it has been assumed that the longitudinal axis of the generator magnet 11 is either perpendicular to the longitudinal axis of the magnetoresistive element 10 (FIG. 8A) or is parallel thereto (FIGS. 8B and 8C). However, if the arrangement shown in FIG. 5B is modified such that the longitudinal axis of the generator magnet now is tilted so as to form an angle of approximately 30° with the longitudinal axis of the magnetoresistive element 10, as shown in FIGS. 9A and 9B, the resultant output signal $e_o$ will conform to the curve graphically shown in FIG. 9C. Although the general shape of this curve is substantially similar to that of the previously described curves, the dynamic range thereof is increased. This is readily observed by comparing the curve of FIG. 9C with the curve shown in FIG. 8B, both of which have been obtained from the same magnet-element configuration, except for the angulation assumed in the FIG. 9 result.

The magnitude of the supply voltage applied to the magnetoresistive element has a marked influence thereon. This is demonstrated by the superimposed curves representing the output voltage $e_o$, as shown in FIG. 10. The uppermost curve has been derived from, for example, the FIG. 5B embodiment with a supply voltage equal to 5.75 volts. As this supply voltage is decreased, it is seen that the general shape of the output voltage curve remains substantially the same, but the actual output voltage levels are varied. Also, the zero crossing points of these curves are seen to correspondingly change. Consequently, as the supply voltage $V_o$ is changed, the dynamic range of the magnetoresistive element, and thus its detecting sensitivity, is correspondingly varied. Hence, these factors can be arbitrarily determined merely by supplying a suitable voltage to the magnetoresistive element.

In the embodiment described hereinabove, it has been assumed that the magnetoresistive element is disposed opposite a pole face of the generator magnet. However, if the element 10 is positioned opposite the thickness direction of the magnet, but aligned such that the flux produced by the magnet is substantially parallel to the plane of the magnetoresistive element, as shown in FIG. 11A, the resultant output signal $e_o$ which is produced as the generator magnet is moved in the $+x$ direction will appear as shown in FIG. 11B. This W-shaped curve admits of various applications and can be used to determine the precise relative position of the generator magnet.

Figure 12:
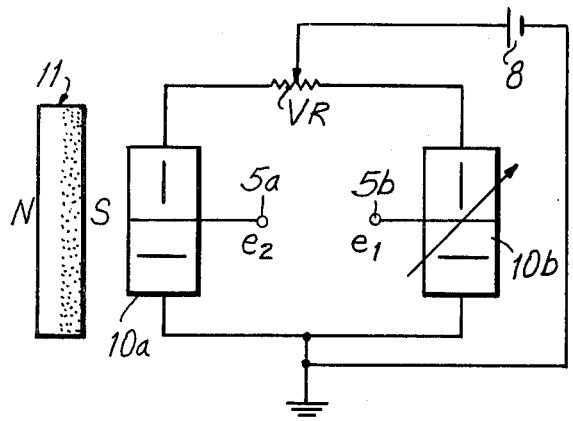
FIGS. 12 and 13 are schematic representations of temperature compensating techniques which can be used with the present invention.

It is recognized that, in the bridge circuit shown in FIGS. 6 and 7, the temperature coefficients of the resistors $R_1$ and $R_2$ differ from the temperature coefficient of the ferromagnetic strips A and B of the magnetoresistive element 10. Hence, depending upon ambient temperature, the bridge circuit might become unbalanced during operation thereof and thus require rebalancing. Furthermore such bridge unbalance could result in erroneous output signals. Accordingly, to avoid this possibility, an alternative embodiment of the present invention contemplates the use of two magnetoresistive elements 10a and 10b which are connected as a bridge circuit, as shown in FIG. 12. If the characteristic resistances of these respective elements are not equal, an adjustable resistor, such as a potentiometer VR can be provided to establish bridge balance. As shown, the supply voltage 8 is supplied through the adjustable resistor VR to the magnetoresistive elements 10a and 10b. Bridge output signals $e_2$ and $e_1$ are derived from the respective magnetoresistive element output terminals 5a and 5b, and are used as previously described with respect to FIGS. 6 and 7 to provide an indication of the positional relation between the generator magnet 11 and the magnetoresistive element 10a.

The effect of the flux produced by the generator magnet 11 upon the output signal $e_1$ derived from the magnetoresistive element 10b can be substantially minimized if the field is applied to that magnetoresistive element at an angle of 45° with respect to the strip A. It is appreciated from equations (94) and (5) above that, when $\theta$ is equal to 45°, then $\cos 2\theta$ is equal to 0 such that the component $\Delta V (\theta)$ of equation (5) is reduced to zero. Hence, the output signal $e_1$ will be substantially equal to $V_o/2$, regardless of the movement of the generator magnet 11. Consequently, the temperature characteristics of the sensing element of FIG. 12 are substantially stabilized so that the output signal $e_o$ is not affected by temperature changes.

Figure 13:
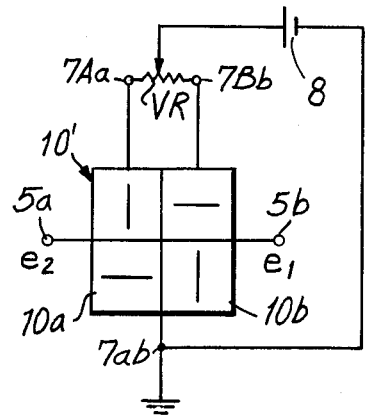

An alternative embodiment of the temperature-compensated magnetoresistive sensing device is depicted in FIG. 13. As shown therein, the respective magnetoresistive elements 10a and 10b are mounted on the same substrate and exhibit the same temperature coefficients. This configuration is capable of detecting an applied magnetic field and has been described in detail in co-pending Application Ser. No. 597,818. In the embodiment depicted in FIG. 13, the output signals produced at the magnetoresistive output terminals 5a and 5b exhibit opposite polarity. Hence, if one of these output signals is first inverted and then is added to the other output signal, it is appreciated that the resultant sensitivity of the illustrated device is increased by a factor of two.

Figure 14A:
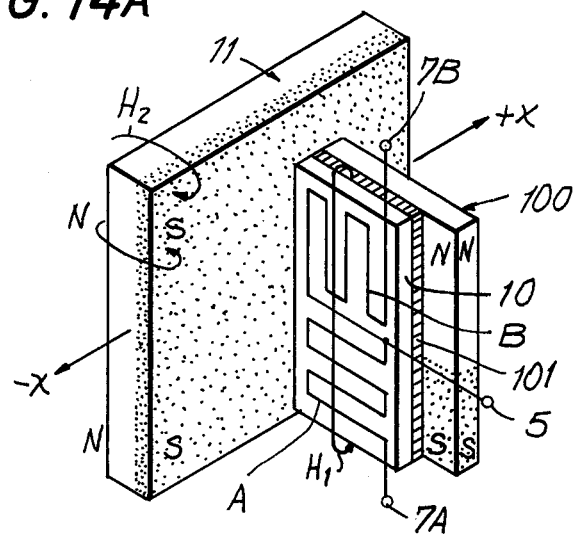
FIGS. 14A and 14B are schematic representations of another embodiment of this invention.
Figure 14C:
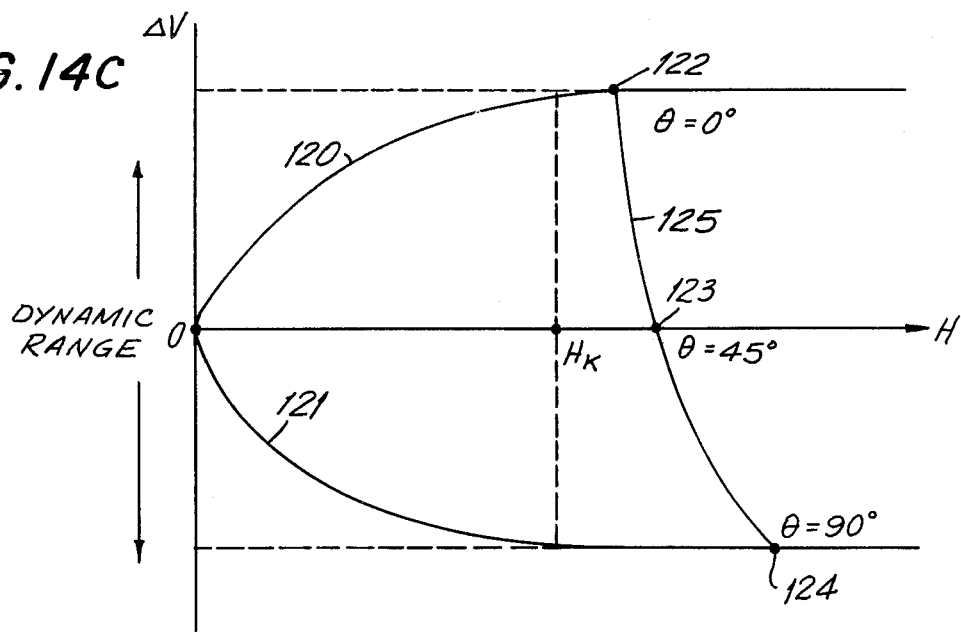
FIG. 14C is a graphical representation of the dynamic range of an output signal derived from the magnetoresistive element shown in FIGS. 14A and 14B.
Figure 14B:
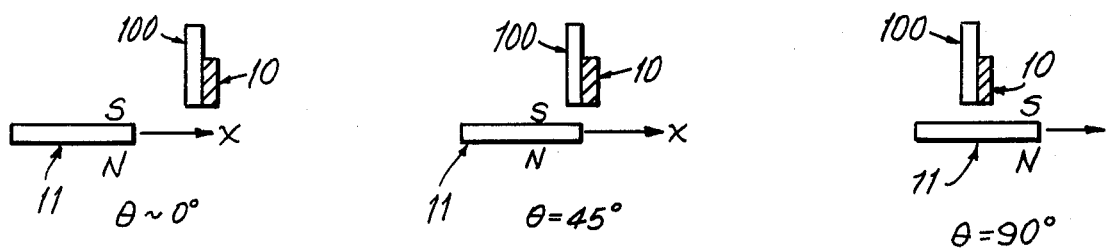

Referring now to FIGS. 14A and 14B, another embodiment of the present invention is shown wherein the magnetoresistive element 10 is supplied with a bias field $H_1$ produced by a bias magnet 100. Preferably, the bias magnet has the same temperature characteristics as the generator magnet 11 and, for example, may be magnetized on barium-ferrite. As shown, the bias magnet 100 is magnetically polarized such that the bias field $H_1$ is predominantly parallel to the current path extending from the current supply terminal 7B to the terminal 7A of the magnetoresistive element 10. As shown, the bias field $H_1$ is perpendicular to the field $H_2$ supplied by the generator magnet 11.

Figure 15:
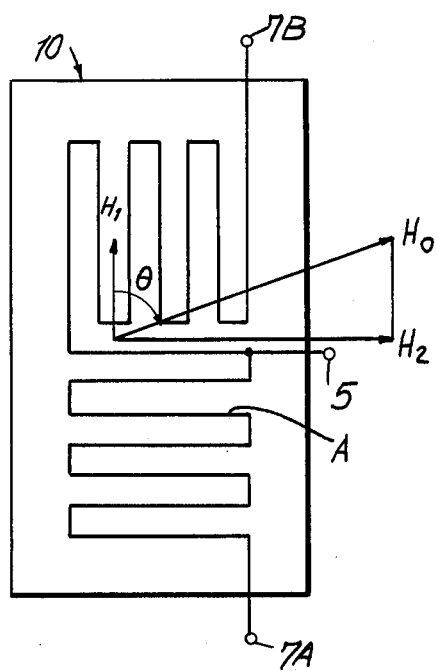
FIG. 15 is a schematic diagram showing how the magnetoresistive element which can be used with this invention is supplied with a composite magnetic field.

The configuration between the generator magnet 11 and the magnetoresistive element 10, the latter being furnished with the bias field $H_1$, is similar to the embodiment previously described with reference to FIG. 5A. The resultant composite field $H_o$ is a function of the bias field $H_1$ and the field $H_2$, having a direction with respect to, for example, the strips B, as shown in FIG. 15.

It is appreciated that, if the bias field $H_1$ is substantially equal to the field $H_2$, the composite vector of the field $H_o$ which is supplied to the magnetoresistive element 10 will have an angle of $\theta$ equal to 45°, when the leading edge of the generator magnet 11 passes the magnetoresistive element. The resultant output signal derived from the element output terminal 5 is, of course, in accordance with equations (4) and (5) above. It is appreciated that the angle $\theta$ thus can be a function of the intensity of the sensed field $H_2$. This, in turn, is a function of the distance between the magnetoresistive element and the generator magnet.

The embodiment shown in FIGS. 14A and 14B offers the advantage that the output signal derived from the magnetoresistive element at the terminal 5 is not deleteriously influenced by variations in ambient temperature. This is because the generator and bis magnets exhibit substantially the same temperature characteristics as mentioned above. Furthermore if the bias field $H_1$ produced by the bias magnet 100 is of sufficient intensity to saturate the magnetoresistive element, then the output signal derived from the magnetoresistive element as a function of the relative position of the leading and trailing edges of the generator magnet 11 with respect to the leading edge of the magnetoresistive element 10 will have a wider dynamic range. This wider dynamic range is achieved even if temperature variations cause a zero drift because the composite field vector $H_o$ exhibits an angle $\theta$ which can be widely selected.

The result obtained by using the bias magnet 100 can be explained with references to FIGS. 14B and 14C. FIG. 14C is a graphical representation of the dynamic range in the output signal $e_o$, represented as $\Delta V$, and its relation with respect to the composite magnetic field $H_o$ which is applied to the magnetoresistive element 10 by the generator magnet 11 in combination with the bias magnet 100. The point $H_k$ is the intensity of the field which is sufficient to saturate the ferromagnetic strips of the magnetoresistive element. The upper curve 120 represents the change in the dynamic attributed solely to the bias field $H_1$ generated by the bias magnet 100. Similarly, the curve 121 represents the change in the dynamic range due solely to the field $H_2$ generated by the generator magnet 11. Now and with reference to FIG. 14B, if it is initially assumed that the generator magnet 11 is quite far from the magnetoresistive element 10 which is fixed to the bias magnet 100, as shown in FIG. 14A, then the field $H_2$ is negligible compared to the bias field $H_1$. Hence, the composite field vector $H_o$ will have an angle of $\theta = 0°$, as viewed in FIG. 15. If the bias field is sufficient to saturate the magnetoresistive element, the dynamic range will be as indicated at the point 122 of the curve in FIG. 14C.

Now, as the generator magnet is moved in the $+x$ direction, as depicted in FIG. 14B, until the leading edge of the generator magnet is aligned with the leading edge of the magnetoresistive element 10, the dynamic range of the output signal will proceed along the curve 125 until the point 123 is reached. At this point, if the fields $H_1$ and $H_2$ are equal, and if the composite field is sufficient to saturate the magnetoresistive element, then the composite field is provided at the angle $\theta = 45°$.

As the generator magnet continues to move in the $+x$ direction, a point will be reached whereat the midpoint of the generator magnet is aligned with the leading edge of the magnetoresistive element 10. At that point, if the field $H_2$ generated by the generator magnet far exceeds the bias field $H_2$, then the dynamic range will reach the point 124. At this point, the composite field $H_o$ forms the angle $\theta = 90°$, as viewed in FIG. 15.

Therefore, if the field $H_2$ is substantially stronger than the bias field $H_1$, it is appreciated that the angle $\theta$ rotates from 0° to approximately 90° as the generator magnet 11 is moved past the magnetoresistive element 10.

If the bias magnet 100 is not used, the curve 121, which represents the relationship between the dynamic range and the field $H_2$ supplied by the generator magnet 11, will be subjected to a zero drift caused by temperature variations. That is, the curve 121 will undesirably vary upwards and downwards from the position shown, to correspondingly constrict the dynamic range of the output signal. This result is avoided by the use of the bias magnet 100.

In view of the foregoing, it should be appreciated that the previously described curves shown in FIGS. 8A-8C can be redrawn wherein the abscissa is proportional to the angle $\theta$. Zero crossings generally will occur when $\theta$ is equal to 45°, and the ordinate can be drawn from the point whereat $\theta$ is equal to 90°. As such, the dynamic range will be represented as the variation in $\theta$ from 0° to 90°.

It is apparent that, if the magnitudes of the respective fields $H_1$ and $H_2$ are selected, as desired, or controlled accordingly, and if the relative directions of these fields with respect to each other likewise are selected or controlled, then the angle $\theta$ can be correspondingly established, as desired. This means that the dynamic range of the output signal $e_o$ can likewise be easily selected. The magnetic fields $H_1$ and $H_2$ are determined in accordance with the dimensions of the magnets, the temperature coefficients thereof, and the like, and thus can easily be chosen or modified to thus derive the particular operating characteristics of the magnetoresistive element to conform with the particular application thereof, as desired.

Although the bias magnet 100 of FIG. 14A can be fixed to the magnetoresistive element 101, it is preferred to use a silicon bond 101, or rubber sheet, to join the element 10 to the magnet 100. The purpose of the silicon bond or rubber sheet is to prevent damage to the magnetoresistive element 10 or to the bias magnet 100 which might arise by reason of the expansion of one with respect to the other. That is, if the temperature coefficient of these devices are not the same, one can expand more or more rapidly than the other. The silicon bond or rubber sheet 101 prevents damage due to this differential in expansion.

The use of the magnetoresistive element 10 in combination with the generator magnet 11 to thus perform the function of a contactless switch now will be described with reference to FIGS. 16A and 16B. As shown in FIG. 16, the configuration between the magnetoresistive element and the generator magnet 11 may be of the type previously described with respect to FIG. 5A. The output of the magnetoresistive element 10 is coupled to a differential amplifier 14 which, for example, may also include the bridge circuit resistors $R_1$ and $R_2$ or, alternatively, an additional magnetoresistive element 10b which is connected to the element 10 in bridge circuit configuration. The output of the differential amplifier is supplied through a wave shaping circuit 15 and an additional amplifier 16 to an actuating device 17. A power supply 8 is shown as being coupled to all of the circuit element for the purpose of energizing same.

The actuating device 17 preferably comprises an indicating circuit for the purpose of indicating the positional relation between the generator magnet 11 and the magnetoresistive element 10. As one example thereof, the indicating circuit 17 may comprise a relay.

In operation, as the generator magnet 11 moves linearly along a path past the magnetoresistive element 10, as shown, for example, in FIGS. 5A and 8A, the signal produced by the magnetoresistive element is supplied to the differential amplifier 14 whereat the output signal $e_o$ is generated. For convenience, the previous graphical representation of the output signal $e_o$ is redrawn in FIG. 16B. The output signal $e_o$ is supplied to the wave shaping circuit which, preferably, comprises a threshold detector. Any conventional threshold detector can be used, such as a Schmitt trigger, or the like, such that when the level of the output signal $e_o$ traverses the predetermined threshold level, as represented by the broken lines in FIG. 16B, an output pulse is produced. This output pulse P is further amplified by amplifier 16 and applied to the relay 17. In this example, the positive transition of the output pulse P is used to turn the relay 17 on, and the negative transition of the output pulse is used to turn the relay off. Of course, if desired, the relay can be such whereby it is energized in response to a negative transition and de-energized in response to a positive transition. In that event, the pulse P, as shown in FIG. 16B, will be inverted.

As is recognized, the selective actuation of the relay 17 can be used to perform any suitable switching function, as desired. Hence, the circuit arrangement of FIG. 16A functions as a contactless switch whereby the switching function is performed without the actual, physical contact of switching contacts by, for example, a mechanical element.

Another application of the present invention is depicted in FIGS. 17A and 17B. In this application, the magnetoresistive element 10, in combination with the generator magnet 11, functions as a probe position detector. That is, the generator magnet 11 is fixed to a rotator element 18 having a pivot axis 19. Equal and opposite spring bias forces are exerted on the rotator 18 by the bias springs 20 and 21 to maintain the rotator at a stable, quiescent position, indicated by 0° angular displacement. As shown, the pole face of the generator magnet 11 is symmetrically positioned with respect to the magnetoresistive element 10. Hence, when no external forces are exerted on the rotatable 18, and the rotator admits of its quiescent position at 0°, the output signal $e_o$ which is produced by the differential amplifier 14 has maximum peak value, as shown in FIG. 17B.

Now, if the rotator 18 is pivoted about the axis 19, as when an external force is applied thereto, the consequential movement of the generator magnet 11 with respect to the magnetoresistive element 10 causes the output signal $e_o$ to change, as shown in FIG. 17B. It is apparent that when the angular displacement exceeds a predetermined amount, the output signal $e_o$ will cross over the zero axis. Hence, if the circuit arrangement previously described with respect to FIG. 16A is used, an indication will be provided when the rotator 18 is displaced from its quiescent position by more than a predetermined angular amount. This amount can, of course, be selected, as desired, merely by changing the threshold detecting level to which the output signal $e_o$ is compared.

Figure 16A:
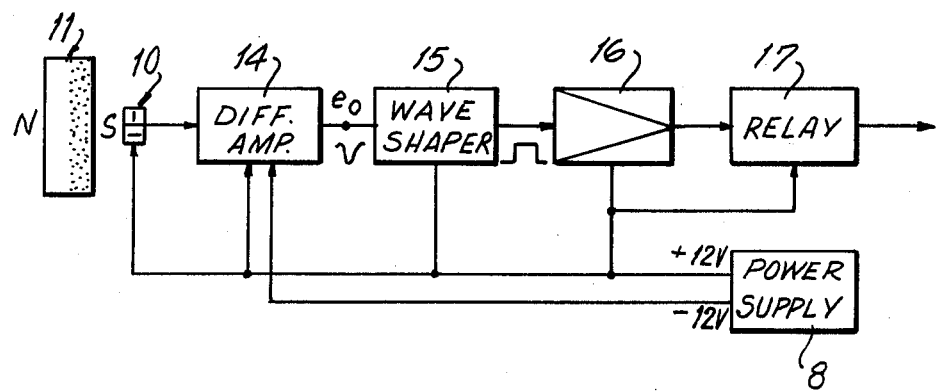
FIGS. 16A and 16B schematically depict how the present invention can be used as a contactless switch.
Figure 16B:
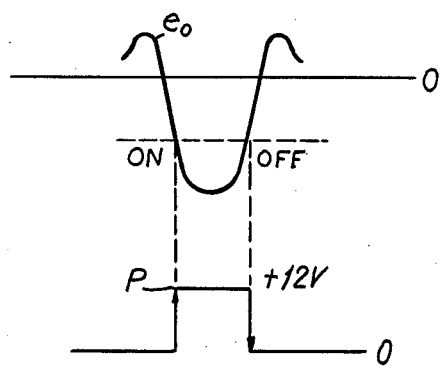

If desired, the output of the differential amplifier 14 may be coupled to further apparatus, other than that shown in FIG. 16A, such as a digital indicator, a computer, or the like. Such apparatus may be used to process the information derived from the relative movement of the rotator 18 with respect to the magnetoresistive element 10.

The principles relied upon to carry out the embodiment shown in FIG. 17A may be used in the embodiment of FIG. 18A. In this latter embodiment, the magnetoresistive element 10 is used in combination with the generator magnet 11 to determine when a rectilinearly movable member 22 has been moved beyond a predetermined amount. Thus, the member 22 may be provided in a suitable housing having opposite end pins 18a extending therefrom and further including bias springs 23 and 24 to symmetrically position the member 22 with respect to the magnetoresistive element 10. More particularly, the mid-point of the generator magnet 11, which is fixed to the movable member 22, is aligned with the magnetoresistive element. Consequently, as is appreciated, if the member 22 is moved in the $+x$ direction, an output signal is produced by the differential amplifier 14 having the wave form shown in FIG. 18B. When the member 22 has been moved beyond a predetermined amount, the wave form $e_o$ will cross a reference, or threshold level. Thus, a suitable threshold level detecting device may be used so as to provide an indication that the rectilinearly movable member 22 is displaced from its quiescent position by more than a predetermined amount. Any suitable devices may be coupled to such threshold detector to utilize this information and to provide a suitable indication thereof.

Plural magnetoresistive elements 10 can be used with plural generator magnets to provide an encoded output signal indicative of, for example, an angular position of a rotary shaft. This application is shown in the embodiment of FIG. 19. As illustrated, a linear array of magnetoresistive elements 10 may be provided on a suitable base support or substrate 27. Opposite this linear array of magnetoresistive elements, a cylinder 25 may be provided having various generator magnets 26 disposed in selected locations on the surface thereof. More particularly, the pole faces of the generator magnets define the cylindrical surface. As one example, only S-pole faces may be provided on the outer cylindrical surface, whereas N-pole faces are provided on the inner cylindrical surface, not shown. These pole faces are disposed in predetermined locations in columns, each of which being aligned with one of the linear array of magnetoresistive elements 10. Preferably, the width of each column is equal, but the size of the S-pole faces varies from column to column, depending upon the information represented thereby.

The cylinder having the generator magnets disposed on the outer surface thereof is mechanically coupled to a rotary shaft so that the cylinder is rotated as the shaft is driven. It is appreciated that, as the cylinder rotates with respect to the array of magnetoresistive elements, various patterns of pole faces will pass beneath the arrayed elements. Consequently, an encoded output signal is produced, in parallel, from all of the magnetoresistive elements, depending upon the instantaneous angular position of the rotatable cylinder. As is recognized, this encoded information signal is a direct representation of the instantaneous angular position of the cylinder. Hence, angular rotation can be encoded and, furthermore, digital information can be provided to represent the particular position of the rotary shaft.

Typical applications of the angular encoder of FIG. 19 include a channel selector switch, such as may be used in television applications, whereby the encoded information represented by the selective positioning of the generator magnets on the surface of the cylinder 25 can be a direct indication of a television channel. Thus, as the shaft rotates to thus change the channel to which the television receiver is tuned, a corresponding indication of channel selection will be provided by the encoded output from the magnetoresistive elements. Other applications of the illustrated embodiment include a rotating switch which can be used for other purposes. Here again, it is noted that switching functions are produced without requiring the mechanical closure of contacts.

Figure 20:
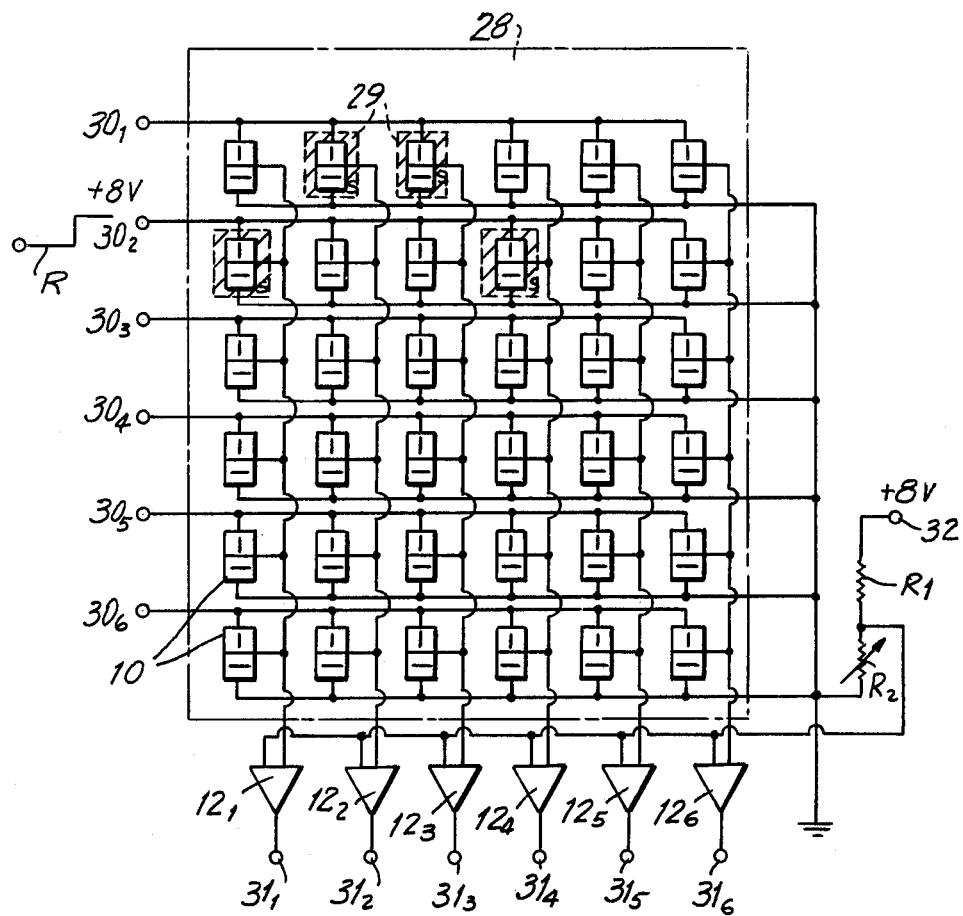
FIG. 20 is a schematic representation of how the present invention can be used to read out encoded information from, for example, a data card.

A still further application of the present invention is depicted in FIG. 20. As shown therein, a matrix array of magnetoresistive elements 10 can be provided to read out selective bits of information represented by the array of generator magnets 29 which are selectively positioned on a suitable support 28. As one example thereof, the support 28 may comprise an information card and the array of generator magnets 29 may represent information on that card.

As shown, the generator magnets 10 are disposed as a matrix array having plural rows and columns. The outputs of all of the magnetoresistive elements in a column are connected in common to a differential amplifier. Thus, in one embodiment wherein an information card has, for example, six readable columns of information, the matrix array of magnetoresistive elements is comprised of six columns of elements and thus requires six differential amplifiers $12_1$-$12_6$. The second input of each of the differential amplifiers $12_1$-$12_6$ is connected in common to the junction defined by resistors $R_1$ and $R_2$. It will be apparent that these resistors are connected to the magnetoresistive elements 10 to thus form a bridge circuit with each element.

In the embodiment shown in FIG. 20, when an information card 28 is presented having information thereon which must be read out by the magnetoresistive elements, the card information is read out row-by-row. This is achieved by connecting all of the current supply terminals of a row of magnetoresistive elements 10 in common to a current supply input. Thus, in the illustrated example, wherein, for example, six rows of magnetoresistive elements are provided, six separate current supply inputs $30_1$-$30_6$ are connected to the six rows of magnetoresistive elements, respectively. When a card 28 is properly positioned with respect to the array of magnetoresistive elements 10, a current pulse R first is supplied to the current input $30_1$. It is appreciated that this input pulse energizes the first row of magnetoresistive elements. Consequently, depending upon which elements are juxtaposed generator magnet 29, the corresponding differential amplifiers $12_1$-$12_6$ will produce output signals $e_o$ at their respective output terminals $31_1$-$31_6$. Hence, an encoded output formed of selective bits at these differential amplifier output terminals is produced, representing the row of information contained in the first row of the information card 28.

When the current pulse signal R terminates at the current input $30_1$, a current pulse signal R is supplied to the current input $30_2$. Hence, at this time, the second row of encoded information on the information card 28 is read out by the second row of magnetoresistive elements 10. A corresponding encoded output signal is obtained, in parallel, at the output terminals $31_1$-$31_6$ of the differential amplifiers $12_1$-$12_6$.

The current pulse R then is successively supplied, in sequence, to the remaining current inputs $30_3$-$30_6$ so as to produce row-by-row read out of the encoded information contained on the information card 28, as represented by the selective positioning of the generator magnets 29.

It is appreciated that the information read out device illustrated in FIG. 20 can be modified such that only a linear array of magnetoresistive elements is used to read out a matrix array of selectively positioned generator magnets. This is achieved by indexing the information card 28 so as to sequentially place each row of encoded information beneath the linear array of magnetoresistive elements so that each such row can be successively read out. Alternatively, although a 6×6 read out matrix of magnetoresistive elements 10 is shown, it is appreciated that a far greater area of encoded information on the information card 28 can be read out. Hence, the information card need merely be indexed both horizontallyy and vertically to position the matrix array of magnetoresistive elements 10 over successive areas for read out.

It is appreciated that the pole faces of the generator magnets 29, such as the S-pole faces, may be provided on the surface of the information card 28 which is opposite the mgnetoresistive elements 10. The elements can be juxtaposed to these generator magnets in any of the configurations previously described with respect to FIGS. 5A-5C. However, in the interest of maximizing space efficiency and thus obtaining a very flat information read out device, the configuration of FIG. 5C should be used. Nevertheless, satisfactory operation is obtained if the FIGS. 5A or 5B configurations are used.

Although the present invention has been particularly shown and described with reference to certain ones of the preferred embodiments, it is contemplated that various changes and modifications in from and details may be made. As one example, if the ferromagnetic film strips A and B which comprise the magnetoresistive element 10 do not have identical characteristics, suitable compensation nevertheless can be obtained. That is, when the ferromagnetic strips A and B are deposited on the substrate, the magnetic particles in the film initially should be magnetically oriented in the proper direction. This magnetic orientation during deposition of the substrate will assure substantially identical characteristics of the strips A and B.

Therefore, it should be understood that the appended claims are to be interpreted as including all of such changes and modifications, as well as various other types of application for which the present invention is particularly well suited.

What is claimed is:

1. Apparatus for producing an output signal upon sensing the proximity of a source of magnetic field, comprising:
   magnetoresistive element means comprised of an insulating substrate, first and second ferromagnetic strips on said substrate for providing first and second main current conducting paths respectively perpendicular to each other, said first and second strips being connected in series to define a junction therebetween from which an output signal is derived and having current supply terminals;
   impedance means connected in parallel with said series-connected strips to thereby form a bridge circuit with said strips, said junction comprising a bridge output terminal; and
   generator magnet means for producing a magnetic field, said generator magnet having a surface disposed in a plane spaced from said magnetoresistive element means to produce an output signal from said junction as a function of the relative positions of leading and trailing edges of said generator magnet means with respect to a leading edge of said magnetoresistive element means.

2. Apparatus according to claim 1 wherein said generator magnet means has a surface which is a pole face and is substantially perpendicular to said substrate.

3. Apparatus according to claim 1 wherein said surface of said generator magnet means is a pole face and is substantially parallel to said substrate.

4. Apparatus according to claim 1 further comprising a bias magnet for supplying a bias field to said magnetoresistive element means, said bias field being substantially perpendicular to the magnetic field produced by said generator magnet means.

5. Apparatus according to claim 4 wherein said bias field further is substantially parallel to said substrate, such that said bias field and said magnetic field produced by said generator magnet means result in a composite field at an angle with respect to a main current conducting path, said output signal derived from said junction being a function of said angle.

6. Apparatus according to claim 5 wherein the intensity of said composite field is sufficient to saturate said magnetoresistive element means.

7. Apparatus according to claim 1 wherein the intensity of the magnetic field produced by said generator magnet means is sufficient to saturate said magnetoresistive element means.

8. Apparatus according to claim 1 further comprising output circuit means coupled to said junction for producing an output representation of said output signal derived at said junction.

9. Apparatus according to claim 8 wherein said output circuit means comprises a differential amplifier having a first input terminal coupled to said junction and a second input terminal coupled to said impedance means.

10. Apparatus according to claim 9 wherein said output circuit means further comprises threshold detecting means coupled to said differential amplifier for detecting when the output from said differential amplifier traverses a predetermined threshold level; and means for indicating the traversal of said predetermined threshold level.

11. Apparatus according to claim 10 wherein said means for indicating comprises relay means actuated in response to the traversal of said predetermined threshold level by said differential amplifier output.

12. Apparatus according to claim 1 wherein said generator magnet means comprises a rotatable member having a quiescent position and being mechanically coupled to a generator magnet having a pole face symmetrically positioned with respect to said magnetoresistive element means when the rotatable member assumes its quiescent position; whereby a predetermined output signal is derived from said junction when said rotatable member is displaced from its quiescent position by more than a predetermined amount.

13. Apparatus according to claim 1 wherein said generator magnet means comprises a rectilinearly movable generator magnet disposed for movement in said plane.

14. Apparatus according to claim 13 wherein said rectilinearly movable generator magnet has a quiescent position whereat a pole face of said generator magnet is symmetrically positioned with respect to said magnetoresistive element means, such that a predetermined output signal is derived from said junction when said rectilinearly movable generator magnet is displaced from its quiescent position by more than a predetermined amount.

15. Apparatus according to claim 1 wherein said magnetoresistive element means comprises an array of elements, each having an insulating substrate, first and second ferromagnetic strips on said substrate for providing first and second main current conducting paths respectively perpendicular to each other, said first and second strips being connected in series to define a junction and having current supply terminals; and said generator magnet means comprises an array of predeterminedly disposed generator magnets having pole faces defining a common surface.

16. Apparatus according to claim 15 wherein said array of elements comprises a fixedly disposed linear array and said array of generator magnets defines a cylindrical surface, said generator magnets being positioned on said cylindrical surface in accordance with encoded representations of the angular position of said cylindrical surface, said cylindrical surface being adapted to rotate past said linear array of elements, whereby a coded output signal is derived from said linear array of elements corresponding to the angular position of said cylindrical surface.

17. Apparatus according to claim 15 wherein said array of elements comprises a matrix array and said array of generator magnets defines a plane surface, said generator magnets being selectively positioned on said plane surface and juxtaposed to an element in accordance with encoded information; and further comprising plural output circuits each coupled in common to the junctions of plural elements; and means for selectively energizing said elements to thereby produce output signals at said output circuits as a read out of said encoded information.

18. Apparatus according to claim 1 wherein said impedance means comprises series-connected resistors, each of which forming an arm of said bridge circuit; and each of said first and second ferromagnetic strips forming an arm of said bridge circuit.

19. Apparatus according to claim 1 wherein said impedance means comprises third and fourth series-connected ferromagnetic strips, the third and fourth ferromagnetic strips providing perpendicularly disposed main current conducting paths; said first, second, third and fourth ferromagnetic strips comprising bridge arms of said bridge circuit.

20. Apparatus according to claim 19 wherein said third and fourth ferromagnetic strips are disposed on a substrate different from the substrate on which said first and second ferromagnetic strips are provided.

21. Apparatus according to claim 20 wherein said third and fourth ferromagnetic strips are provided with a magnetic field such that an output signal at the junction defined by the series connection of said third and fourth ferromagnetic strips is not affected by the relative positions of the leading and trailing edges of said generator magnet with respect thereto.

22. Apparatus according to claim 19 wherein said first, second, third and fourth ferromagnetic strips all are disposed on a common substrate.

* * * * *